US012777907B2

(12) United States Patent
Seo et al.

(10) Patent No.: US 12,777,907 B2
(45) Date of Patent: Oct. 27, 2026

(54) SEMICONDUCTOR PACKAGE

(71) Applicant: SAMSUNG ELECTRONICS CO., LTD., Suwon-si (KR)

(72) Inventors: Sunkyoung Seo, Cheonan-si (KR); Chajea Jo, Yongin-si (KR); Yeongseon Kim, Suwon-si (KR); Juhyeon Kim, Cheonan-si (KR); Hyoeun Kim, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 743 days.

(21) Appl. No.: 17/978,507

(22) Filed: Nov. 1, 2022

(65) Prior Publication Data

US 2023/0138813 A1 May 4, 2023

(30) Foreign Application Priority Data

Nov. 2, 2021 (KR) ........................ 10-2021-0148959
Feb. 9, 2022 (KR) ........................ 10-2022-0016973

(51) Int. Cl.
*H10W 20/20* (2026.01)
*H10W 72/90* (2026.01)
*H10W 90/00* (2026.01)

(52) U.S. Cl.
CPC ........... *H10W 20/20* (2026.01); *H10W 90/00* (2026.01); *H10W 72/921* (2026.01); (Continued)

(58) Field of Classification Search
CPC ........... H01L 2224/08145; H01L 24/08; H01L 2224/80895; H01L 2224/80896; (Continued)

(56) References Cited

U.S. PATENT DOCUMENTS 7,453,150 B1 11/2008 Mcdonald
8,637,968 B2 1/2014 Haba et al.
(Continued)

FOREIGN PATENT DOCUMENTS

KR 10-2010-0130165 A 12/2010
KR 10-2014-0064522 A 5/2014
(Continued)

OTHER PUBLICATIONS

Office Action issued Oct. 1, 2025 in corresponding KR Patent Application No. 10-2022-0016973 with English machine translation.

*Primary Examiner* — Jessica S Manno
*Assistant Examiner* — Victor Joseph Lasasso
(74) *Attorney, Agent, or Firm* — Morgan, Lewis & Bockius LLP

(57) ABSTRACT

A first semiconductor chip includes a first semiconductor substrate, a first wiring structure arranged on the first semiconductor substrate, a plurality of through electrodes penetrating through at least a portion of the first semiconductor substrate, and a plurality of first bonding pads respectively connected to the plurality of through electrodes. A second semiconductor chip is stacked on the first semiconductor chip and includes a second semiconductor substrate, a second wiring structure arranged on the second semiconductor substrate, and a second bonding pad connected to each of the plurality of first bonding pads and arranged on the active surface of the second semiconductor substrate. Each first bonding pad has a top surface that is in direct contact with the second bonding pad and a bottom surface that is in direct contact with one through electrode.

8 Claims, 16 Drawing Sheets

(52) U.S. Cl.
CPC ........ *H10W 72/951* (2026.01); *H10W 72/952* (2026.01); *H10W 90/792* (2026.01)

(58) Field of Classification Search
CPC ... H01L 23/481; H01L 25/50; H01L 25/0657; H01L 2924/00014; H01L 2224/94; H01L 2225/06541; H10D 84/038; H10D 88/01; H10D 1/716; H10W 72/20; H10W 72/012; H10W 72/263; H10W 80/312; H10W 80/327; H10W 20/20
See application file for complete search history.

(56) References Cited

U.S. PATENT DOCUMENTS

| | | | |
|---|---|---|---|
| 9,847,277 B2 | 12/2017 | Oganesian et al. | |
| 10,128,223 B2 | 11/2018 | Kawasaki et al. | |
| 10,886,245 B2 | 1/2021 | Chen et al. | |
| 10,950,578 B2 | 3/2021 | Lee et al. | |
| 2012/0056330 A1 | 3/2012 | Lee et al. | |
| 2013/0264688 A1 | 10/2013 | Qian et al. | |
| 2020/0185330 A1* | 6/2020 | Yu | H01L 24/24 |
| 2020/0279841 A1* | 9/2020 | Sanuki | H01L 25/50 |
| 2021/0057332 A1* | 2/2021 | Chen | H01L 21/6836 |

FOREIGN PATENT DOCUMENTS

| | | |
|---|---|---|
| KR | 10-2016-0011017 A | 1/2016 |
| KR | 10-2016-0066120 A | 6/2016 |

* cited by examiner

SEMICONDUCTOR PACKAGE

CROSS-REFERENCE TO RELATED APPLICATIONS

This application claims priority under 35 U.S.C. § 119 to Korean Patent Application No. 10-2021-0148959, filed on Nov. 2, 2021 in the Korean Intellectual Property Office and Korean Patent Application No. 10-2022-0016973, filed on Feb. 9, 2022, in the Korean Intellectual Property Office, the disclosures of which are incorporated by reference in their entireties herein.

1. TECHNICAL FIELD

The present inventive concept relates to a semiconductor package, and more particularly, to a semiconductor package including stacked semiconductor chips.

2. DISCUSSION OF RELATED ART

As electronic products have become increasingly miniaturized, multifunctional and exhibiting high performance, a demand for semiconductor packages to be highly integrated and operate at high speed has increased. To this end, a semiconductor package including stacked semiconductor chips has been developed.

SUMMARY

Embodiments of the present inventive concept provide a semiconductor package having stacked semiconductor chips and increased operation reliability.

According to an embodiment of the present inventive concept, a semiconductor package includes a first semiconductor chip comprising a first semiconductor substrate having active and inactive surfaces that are opposite to each other. A first wiring structure is arranged on the active surface of the first semiconductor substrate. A plurality of through electrodes penetrates through at least a portion of the first semiconductor substrate. A plurality of first bonding pads is respectively connected to the plurality of through electrodes. A second semiconductor chip is stacked on the first semiconductor chip and comprises a second semiconductor substrate having active and inactive surfaces that are opposite to each other. A second wiring structure is arranged on the active surface of the second semiconductor substrate. A second bonding pad is connected to each of the plurality of first bonding pads and arranged on the active surface of the second semiconductor substrate. Each first bonding pad of the plurality of first bonding pads has a top surface that is in direct contact with the second bonding pad and a bottom surface that is in direct contact with one through electrode of the plurality of through electrodes.

According to an embodiment of the present inventive concept, a semiconductor package includes a first semiconductor chip comprising a first semiconductor substrate having active and inactive surfaces that are opposite to each other. A first wiring structure is arranged on the active surface of the first semiconductor substrate and includes a plurality of metal wirings located at different vertical levels from each other. A through electrode penetrates through at least a portion of the first semiconductor substrate. A first metal structure is disposed on the through electrode. A first bonding pad is connected to the first metal structure. A second semiconductor chip is stacked on the first semiconductor chip and comprises a second semiconductor substrate having active and inactive surfaces that are opposite to each other. A second wiring structure is arranged on the active surface of the second semiconductor substrate. A second bonding pad is connected to the first bonding pad and is arranged on the active surface of the second semiconductor substrate. The first bonding pad has a top surface that is in direct contact with the second bonding pad and a bottom surface that is in direct contact with the first metal structure. The through electrode protrudes from the first semiconductor substrate and is in direct contact with the first metal structure.

According to an embodiment of the inventive concept, a semiconductor package includes a first semiconductor chip comprising a first semiconductor substrate having active and inactive surfaces that are opposite to each other. A first wiring structure is arranged on the active surface of the first semiconductor substrate and includes a plurality of metal wirings located at different vertical levels from each other and a plurality of vias located at different vertical levels from each other. A through electrode penetrates through at least a portion of the first semiconductor substrate. A plurality of metal structures is disposed on the through electrode. The plurality of metal structures directly contacts each other. A first bonding pad is connected to the plurality of metal structures. A second semiconductor chip is stacked on the first semiconductor chip and comprises a second semiconductor substrate having active and inactive surfaces that are opposite to each other. A second wiring structure is arranged on the active surface of the second semiconductor substrate. A second bonding pad is connected to the first bonding pad and is arranged on the active surface of the second semiconductor substrate. The first bonding pad has a top surface that is in direct contact with the second bonding pad and a bottom surface that is in direct contact with the plurality of metal structures. The through electrode protrudes from the first semiconductor substrate and is in direct contact with the plurality of metal structures.

BRIEF DESCRIPTION OF THE DRAWINGS

Embodiments of the present inventive concept will be more clearly understood from the following detailed description taken in conjunction with the accompanying drawings in which.

DETAILED DESCRIPTION OF EMBODIMENTS

Figure 1:
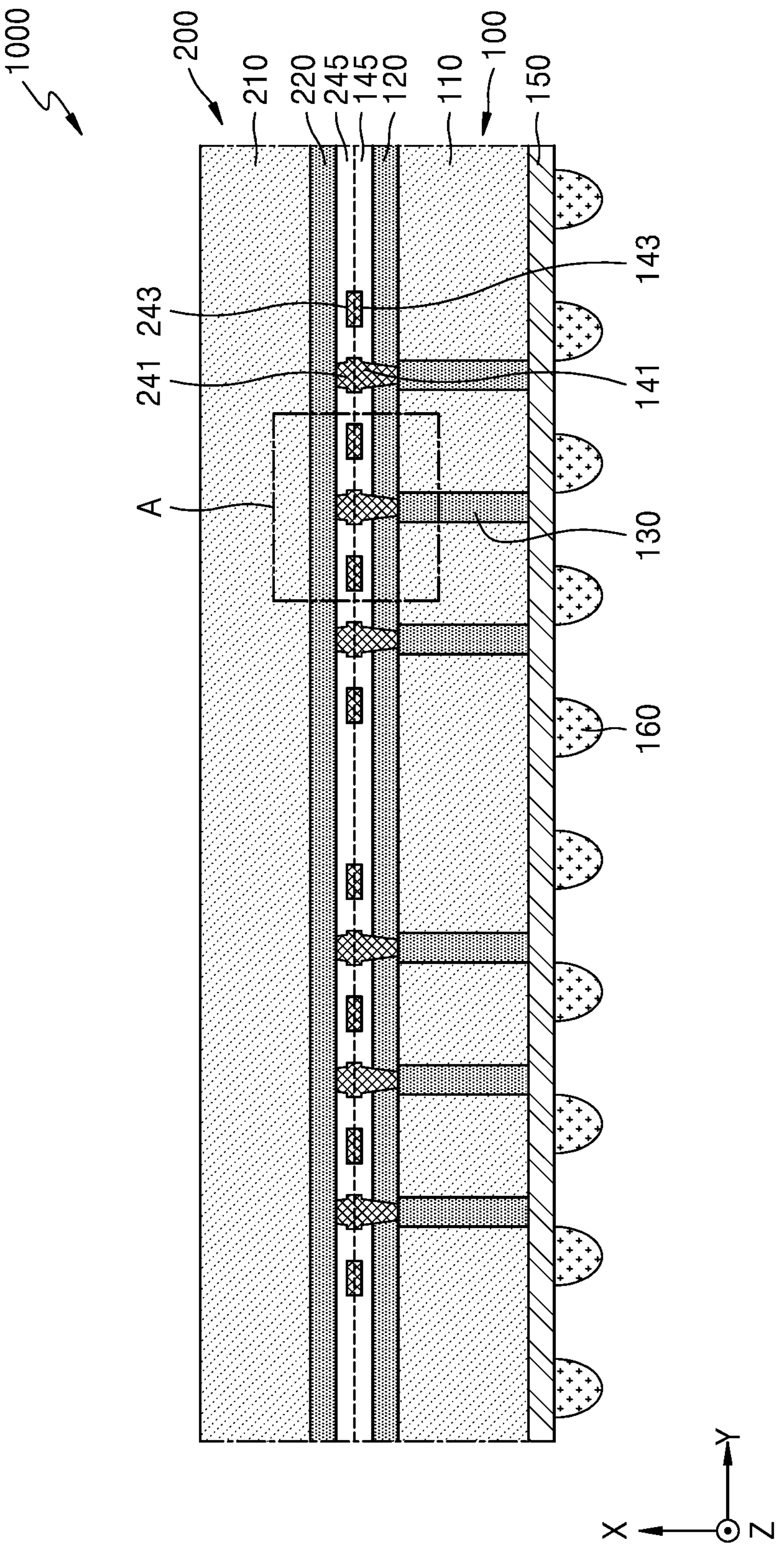
FIG. 1 is a cross-sectional view of a semiconductor package according to an embodiment of the present inventive concept.

Hereinafter, embodiments of the present inventive concept will be described in detail with reference to the accompanying drawings. Same reference numerals are used for same components in the drawings, and repeated description thereof may be omitted for economy of description.

Hereinafter, unless defined otherwise, a direction parallel to a top surface of a first semiconductor substrate 110 indicates a horizontal direction, and a length in a parallel direction to the top surface of the first semiconductor substrate 110 indicates a horizontal width. Further, a direction perpendicular to the top surface of the first semiconductor substrate 110 indicates a vertical direction, and a length in a perpendicular direction to the top surface of the first semiconductor substrate 110 indicates a vertical height.

FIG. 1 is a cross-sectional view of a semiconductor package 1000 according to an embodiment of the present inventive concept. A central dashed line in FIG. 1 indicates a bonding portion (e.g., a bonding surface) of a first semiconductor chip 100 and a second semiconductor chip 200.

Referring to FIG. 1, the semiconductor package 1000 may include a first semiconductor chip 100 and a second semiconductor chip 200. The second semiconductor chip 200 may be stacked on the first semiconductor chip 100. In FIG. 1, horizontal widths of the first semiconductor chip 100 and the second semiconductor chip 200 are illustrated to be the same, but embodiments of the present inventive concept are not necessarily limited thereto. For example, in an embodiment the horizontal width of the first semiconductor chip 100 may be less than the horizontal width of the second semiconductor chip 200.

The first semiconductor chip 100 may be electrically connected to the second semiconductor chip 200 through a plurality of first bonding pads 141 and a plurality of second bonding pads 241, thereby transmitting and receiving signals and providing power and ground.

The first semiconductor chip 100 may include a first semiconductor substrate 110 having opposite active and inactive surfaces, a first wiring structure 120 arranged on the active surface of the first semiconductor substrate 110, a plurality of through electrodes 130 penetrating through at least a portion of the first semiconductor substrate 110, a plurality of first bonding pads 141 connected to each of a plurality of through electrodes 130, and a first wiring insulating layer 145. In some embodiments, the first semiconductor chip 100 may further include first dummy structures 143 arranged to be spaced apart from the first bonding pads 141 (e.g., in a horizontal direction) and on the active surface of the first semiconductor substrate 110.

In the semiconductor package 1000 according to an embodiment, the active surface of the first semiconductor chip 100 may be arranged such that the active surface faces upwards and the inactive surface faces downwards so that they are opposite to each other (e.g., in a vertical direction). In this embodiment, a redistribution structure 150 may be arranged on the inactive surface of the first semiconductor chip 100. The semiconductor package 1000 may be connected to, for example, a package substrate, etc. through a connection bump 160. In an embodiment, a first rear pad may be located between the redistribution structure 150 and the connection bump 160 to connect the redistribution structure 150 and the connection bump 160 to each other.

The second semiconductor chip 200 may include a second semiconductor substrate 210 having opposite active and inactive surfaces, a second wiring structure 220 arranged on the active surface of the second semiconductor substrate 210, a second bonding pad 241 connected to the first bonding pad 141 and arranged on the active surface of the second semiconductor substrate 210, and a second wiring insulating layer 245. In some embodiments, the second semiconductor chip 200 may further include second dummy structures 243 arranged to be spaced apart from the second bonding pads 241 (e.g., in a horizontal direction) and on the active surface of the second semiconductor substrate 210.

In an embodiment, the first semiconductor substrate 110 and the second semiconductor substrate 210 may, for example, include a Group IV semiconductor such as silicon (Si) or germanium (Ge), a Group IV-IV compound semiconductor such as silicon-germanium (SiGe) or siliconcarbide (SiC), or a Group III-V compound semiconductor such as gallium arsenide (GaAs), indium arsenide (InAs), or indium phosphide (InP). The first semiconductor substrate 110 and the second semiconductor substrate 210 may include a conductive region, for example, a well doped with impurity. The first semiconductor substrate 110 and the second semiconductor substrate 210 may include various device isolation structures such as a shallow trench isolation (STI) structure. However, embodiments of the present inventive concept are not necessarily limited thereto and the device isolation structures may vary.

Each of the first semiconductor substrate 110 and the second semiconductor substrate 210 may include the active surface and the inactive surface opposite to the active surface. A semiconductor device including various types of individual devices may be formed on the active surfaces of each of the first semiconductor substrate 110 and the second semiconductor substrate 210. For example, in an embodiment the plurality of individual devices may include a variety of microelectronic devices, for example, a metal-oxide-semiconductor field effect transistor (MOSFET) such as a complementary metal-oxide-semiconductor (CMOS) transistor, a system large scale integration (LSI), an image sensor such as a CMOS imaging sensor, a micro-electro-mechanical system (MEMS), an active device, a passive device, and the like. The plurality of individual devices may be electrically connected to the conductive region of the first semiconductor substrate 110 or the second semiconductor substrate 210. Each of a first semiconductor device and a second semiconductor device may further include a conductive wiring or a conductive plug electrically connecting at least two of the plurality of individual devices, or a the plurality of individual devices and the conductive region of each of the first semiconductor substrate 110 and the second semiconductor substrate 210. Further, each of the plurality of individual devices may be electrically isolated from other adjacent individual devices by an insulating layer.

In some embodiments, at least one of the first semiconductor chip 100 and the second semiconductor chip 200 may be a memory chip or a logic chip. The memory chip may include a volatile memory chip, such as dynamic random access memory (DRAM) or static random access memory (SRAM), or a non-volatile memory chip, such as phase-change random access memory (PRAM), magnetoresistive random access memory (MRAM), ferroelectric random access memory (FeRAM), or resistive random access memory (RRAM). In addition, the logic chip may be, for example, a microprocessor, an analog device, or a digital signal processor. However, embodiments of the present inventive concept are not necessarily limited thereto.

The first wiring structure 120 and the second wiring structure 220 may include, for example, metal material such as aluminum, copper, or tungsten. In some embodiments, the first wiring structure 120 and the second wiring structure 220 may consist of a barrier layer for wiring or a metal layer for wiring. In an embodiment, the barrier film for wiring may include, for example, metal, metal nitride, or alloy. The metal layer for wiring may include, for example, at least one metal selected from W, Al, Ti, Ta, Ru, Mn, or Cu.

Each of the first wiring structure 120 and the second wiring structure 220 may include a plurality of metal wirings and a plurality of vias connecting the plurality of metal wirings. In some embodiments, each of the first wiring structure 120 and the second wiring structure 220 may have a multilayer wiring structure including a plurality of metal wirings and a plurality of vias located at different vertical levels.

The first wiring insulating layer 145 and the second wiring insulating layer 245 may respectively surround the first wiring structure 120 and the second wiring structure 220. In some embodiments, the first wiring insulating layer 145 may surround both lateral sides and a bottom surface of the first dummy structures 143, and the second wiring insulating layer 245 may surround both lateral sides and the top surface of the second dummy structures 243. In some embodiments, when each of the first wiring structure 120 and the second wiring structure 220 has a multilayer wiring structure, each of the first wiring insulating layer 145 and the second wiring insulating layer 245 may have a multilayer structure in which a plurality of insulating layers are stacked, in correspondence to the multilayer wiring structure of the first wiring structure 120 and the second wiring structure 220, respectively. For example, in an embodiment each of the first wiring insulating layer 145 and the second wiring insulating layer 245 may include a plurality of insulating layers, and the plurality of insulating layers may consist of silicon oxide, silicon nitride, silicon oxynitride, insulating polymer, or any combination thereof. For example, in an embodiment at least a part of each of the first wiring insulating layer 145 and the second wiring insulating layer 245 may consist of a polymer formed by photosensitive polyimide (PSPI). For example, in an embodiment each of the first wiring insulating layer 145 and the second wiring insulating layer 245 may have a multilayer structure in which a layer consisting of nitride and a layer consisting of PSPI are stacked. For example, each of the first wiring insulating layer 145 and the second wiring insulating layer 245 may have a multilayer structure in which a layer consisting of nitride and a layer consisting of TEOS are stacked.

The plurality of through electrodes 130 may penetrate through at least a portion of the first semiconductor substrate 110. In an embodiment, each of the plurality of through electrodes 130 may include a conductive plug penetrating through at least a portion of the first semiconductor substrate 110 and a conductive barrier layer surrounding the conductive plug. In an embodiment, one of the through electrodes 130 and the first bonding pad 141 corresponding to the through electrode 130 may be aligned in the vertical direction and overlap one another, and the through electrode 130 may not overlap the first wiring structure 120 in the vertical direction. In some embodiments, one of the through electrodes 130, the second bonding pad 241 connected to the first bonding pad 141 corresponding to the through electrode 130, and the second wiring structure 220 connected to the second bonding pad 241 may be aligned in the vertical direction and overlap one another. In an embodiment, the top surface of each of the plurality of through electrodes 130 may be located in a similar or the same vertical level with the top surface of the first semiconductor substrate 110. In an embodiment, the horizontal width of each of the plurality of through electrodes 130 may be in a range of about 2 μm to about 3 μm. However, embodiments of the present inventive concept are not necessarily limited thereto.

In an embodiment, the redistribution structure 150 may include, for example, metal material such as aluminum, copper, or tungsten. In some embodiments, the redistribution structure 150 may include a plurality of redistribution patterns and a plurality of vias. In some embodiments, the redistribution structure 150 may have a multilayer wiring structure including a plurality of redistribution patterns located in different vertical levels and a plurality of vias located in different vertical levels.

The connection bump 160 may be arranged on the bottom surface of the redistribution structure 150. The connection bump 160 may include, for example, copper, silver, tin, or alloys thereof, but embodiments of the present inventive concept are not necessarily limited thereto.

The first bonding pads 141 may be arranged on the active surface of the first semiconductor substrate 110, and the second bonding pads 241 may be arranged on the active surface of the second semiconductor substrate 210. In an embodiment, the bottom surface of the first bonding pad 141 may be in direct contact with the top surface of the through electrode 130 to be electrically connected to the through electrode 130. The top surface of the first bonding pad 141 may be in direct contact with the bottom surface of the second bonding pad 241 to be electrically connected to the second bonding pad 241. For example, the first bonding pad 141 may be located between the through electrode 130 and the second bonding pad 241 and may have a top surface that is in direct contact with the second bonding pad 241 and a bottom surface that is in direct contact with the through electrode 130. The top surface of the second bonding pad 241 may be in direct contact with the bottom surface of the second wiring structure 220 to be electrically connected to the second wiring structure 220. The first bonding pad 141 may be connected to the second bonding pad 241 to electrically connect the first semiconductor chip 100 and the second semiconductor chip 200 to each other. In an embodiment, the first bonding pads 141 and the second bonding pads 241 may include, for example, copper. In some embodiments, the horizontal width of the first bonding pads 141 and the horizontal width of the second bonding pads 241 may be the same. However, embodiments of the present inventive concept are not necessarily limited thereto.

The first dummy structures 143 and the second dummy structures 243 may be arranged in the first wiring insulating layer 145 and the second wiring insulating layer 245, respectively. The first dummy structures 143 and the second dummy structures 243 may be directly connected and bonded to each other. In some embodiments, the horizontal width of the first dummy structures 143 and the second dummy structures 243 may be greater than the horizontal width of the first bonding pads 141 and the second bonding pads 241, respectively. In some embodiments, a pitch between the first dummy structure 143 and the first bonding pad 141 may be the same as a pitch between the second dummy structure 243 and the second bonding pad 241. However, embodiments of the present disclosure are not necessarily limited thereto. In some embodiments, the vertical height of the first dummy structures 143 and the second dummy structures 243 may be less than the vertical height of the first bonding pads 141 and the second bonding pads 241, respectively.

Figure 2A:
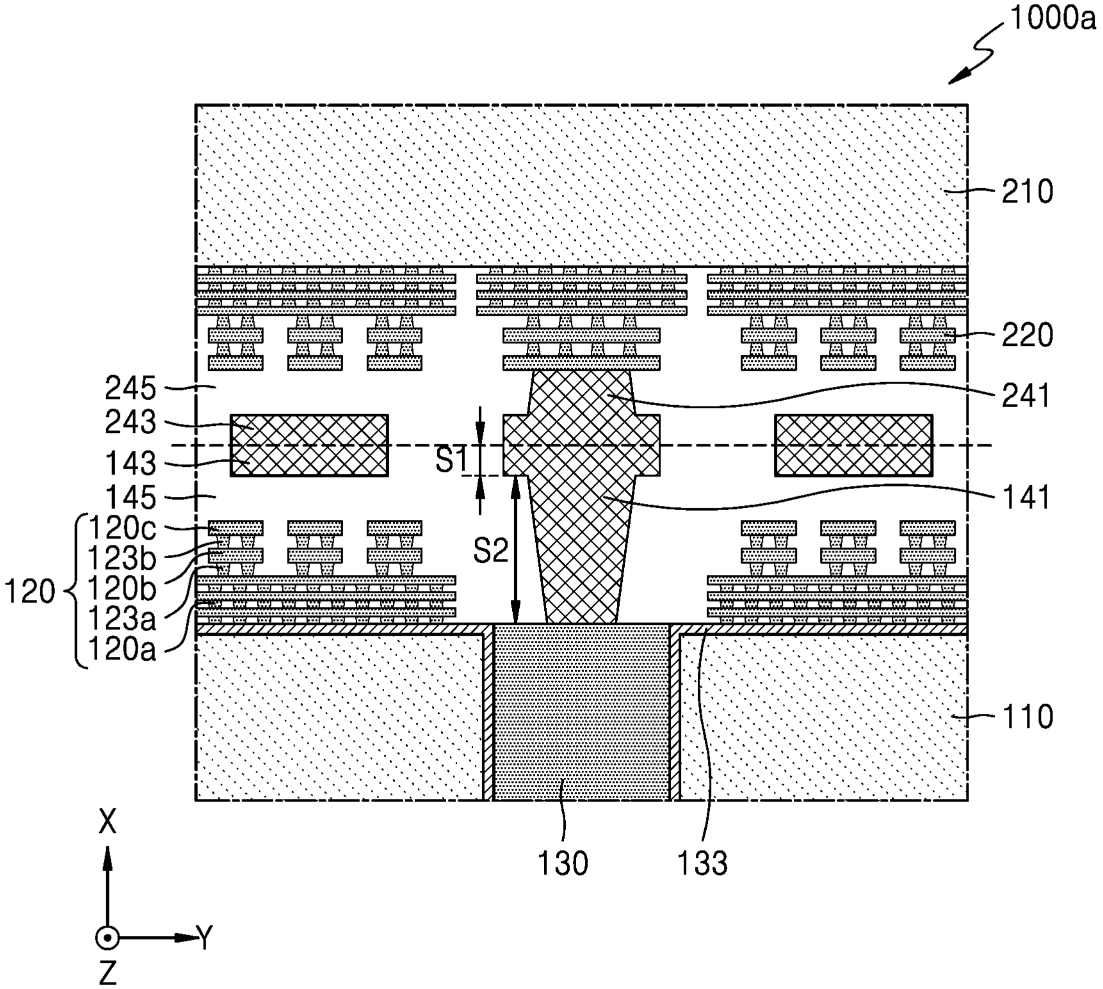
FIGS. 2A and 2B are enlarged cross-sectional views of part A of FIG. 1 according to embodiments of the present inventive concept.
Figure 2B:
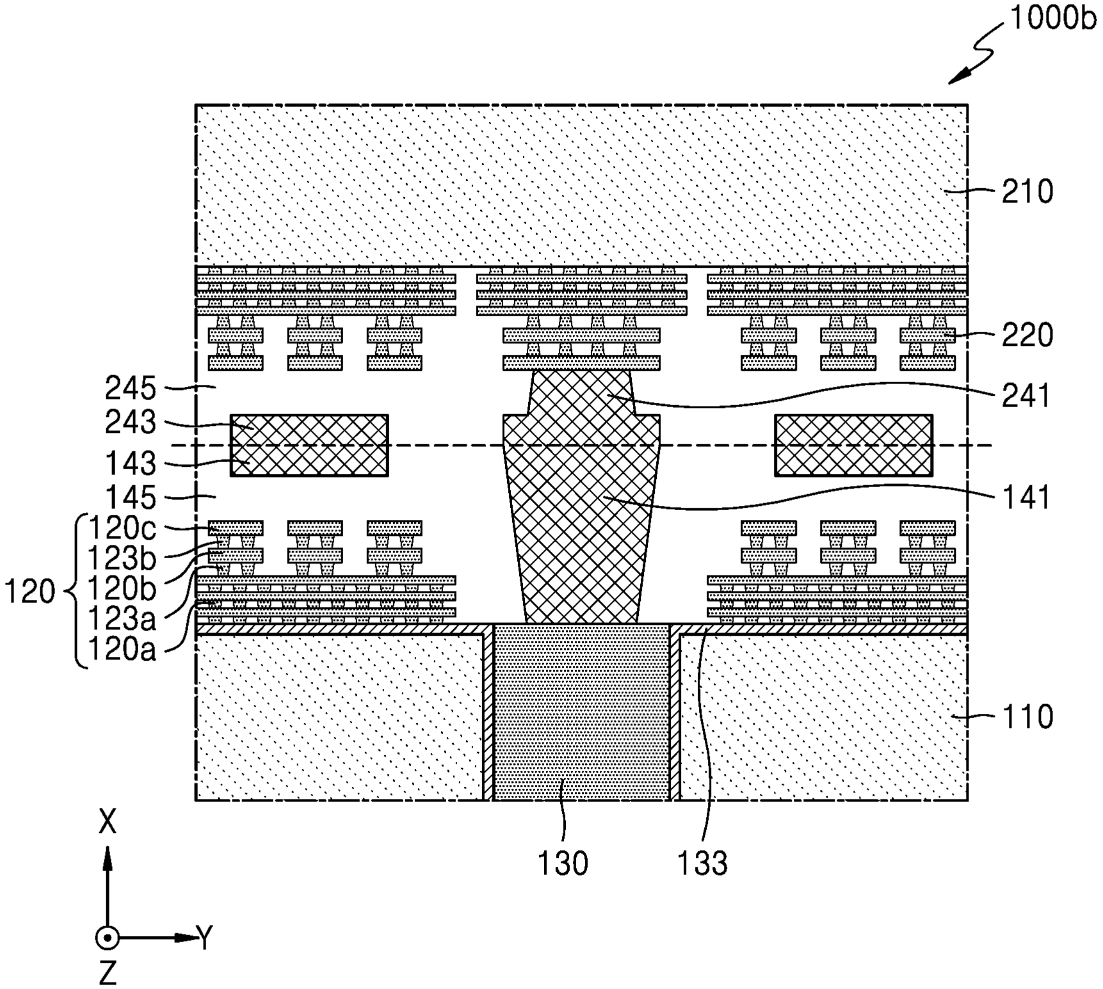

FIGS. 2A and 2B are enlarged cross-sectional views of part A of FIG. 1. A central dashed line in FIGS. 2A and 2B indicates a bonding portion (e.g., a bonding surface) of the first semiconductor chip 100 and the second semiconductor chip 200. Since the configurations of the semiconductor packages 1000*a* and 1000*b* of FIGS. 2A and 2B are similar to the semiconductor package 1000 of FIG. 1, the differences between the semiconductor package 1000 and the semiconductor packages 1000*a* and 1000*b* are mainly described for economy of description.

Referring to FIGS. 1 and 2A, the semiconductor package 1000*a* may include the first wiring structure 120 including the first semiconductor substrate 110, a plurality of metal wirings 120*a*, 120*b*, and 120*c* (hereinafter, also referred to as a first metal wiring 120*a*, a second metal wiring 120*b*, and a third metal wiring 120*c*), and a plurality of vias 123*a* and 123*b* (hereinafter, also referred to as a first via 123*a* and a second via 123*b*), the first semiconductor chip 100 including the plurality of through electrodes 130, the plurality of first bonding pads 141, the plurality of first dummy structures 143, and the plurality of first wiring insulating layers 145, and the second semiconductor chip 200 including the second semiconductor substrate 210, the second wiring structure 220, the plurality of second bonding pads 241, and the second wiring insulating layer 245. While an embodiment of FIG. 2A shows the plurality of metal wirings 120*a*, 120*b* and 120*c* including 3 wirings, the numbers of the plurality of metal wirings may vary.

Each of the plurality of first bonding pads 141 may be located between the second bonding pad 241 corresponding to the first bonding pad 141, and the through electrode 130. For example, the top surface of the first bonding pad 141 is in direct contact with the bottom surface of the second bonding pad 241, and the bottom surface of the first bonding pad 141 may be in direct contact with the top surface of the through electrode 130. In an embodiment, the bottom surface of the first bonding pad 141 (e.g., the bonding surface between the first bonding pad 141 and the through electrode 130) may be located at the same vertical level as the bottom surface of the first metal wiring 120*a*. In this embodiment, the bottom surface of the first bonding pad 141 may be coplanar with the bottom surface of the first metal wiring 120*a*. In an embodiment, each of the plurality of first bonding pads 141 may include a first portion S1 that is in direct contact with the second bonding pad 241 and has a constant horizontal width and a second portion S2 that is in direct contact with the through electrode 130 and has a horizontal width that decreases in a direction towards the through electrode 130. For example, the horizontal width of the second portion S2 may decrease as a distance to the through electrode 130 decreases. For example, the horizontal width of the first portion S1 may be greater than the horizontal width of the second portion S2. In an embodiment, the horizontal width of the through electrode 130 may be greater than the horizontal widths of the first portion S1 and second portion S2 of the first bonding pad 141. In an embodiment, the length of the first bonding pad 141 in the vertical direction may be in a range of about 3 μm to about 20 μm. However, embodiments of the present disclosure are not necessarily limited thereto.

The first bonding pad 141 may be directly connected to the through electrode 130 to thereby increase the Signal integrity (SI) and Power integrity (PI) characteristics of the semiconductor package. Further, the first bonding pad 141 may extend from (e.g., include) the top surface that is in direct contact with the second bonding pad 241 to the bottom surface that is in direct contact with the through electrode 130 corresponding to the second bonding pad 241, thereby obtaining a process condition necessary for the annealing process performed in the bonding process of the first bonding pad 141 and the second bonding pad 241.

Referring to FIGS. 1 and 2B, the semiconductor package 1000*a* may include the first wiring structure 120 including the first semiconductor substrate 110, the plurality of metal wirings 120*a*, 120*b*, and 120*c*, and the plurality of vias 123*a* and 123*b*, the first semiconductor chip 100 including the plurality of through electrodes 130, the plurality of first bonding pads 141, the plurality of first dummy structures 143, and the plurality of first wiring insulating layers 145, and the second semiconductor chip 200 including the second semiconductor substrate 210, the second wiring structure 220, the plurality of second bonding pads 241, and the second wiring insulating layer 245.

In an embodiment, the horizontal width of each of the plurality of first bonding pads 141 may decrease towards the through electrode 130 corresponding to the first bonding pad 141. For example, the horizontal width of each of the plurality of first bonding pads 141 may gradually decrease in a continuous manner from the top surface that is in direct contact with the second bonding pad 241 to the bottom surface that is in direct contact with the through electrode 130 corresponding to the first bonding pad 141 to thereby form a taper shape. Thus, the horizontal width of the top surface of the first bonding pad 141 may be greater than the horizontal width of the bottom surface of the first bonding pad 141. In an embodiment, the length of the first bonding pad 141 in the vertical direction may be in a range of about 3 μm to about 20 μm. However, embodiments of the present disclosure are not necessarily limited thereto.

Figure 3:
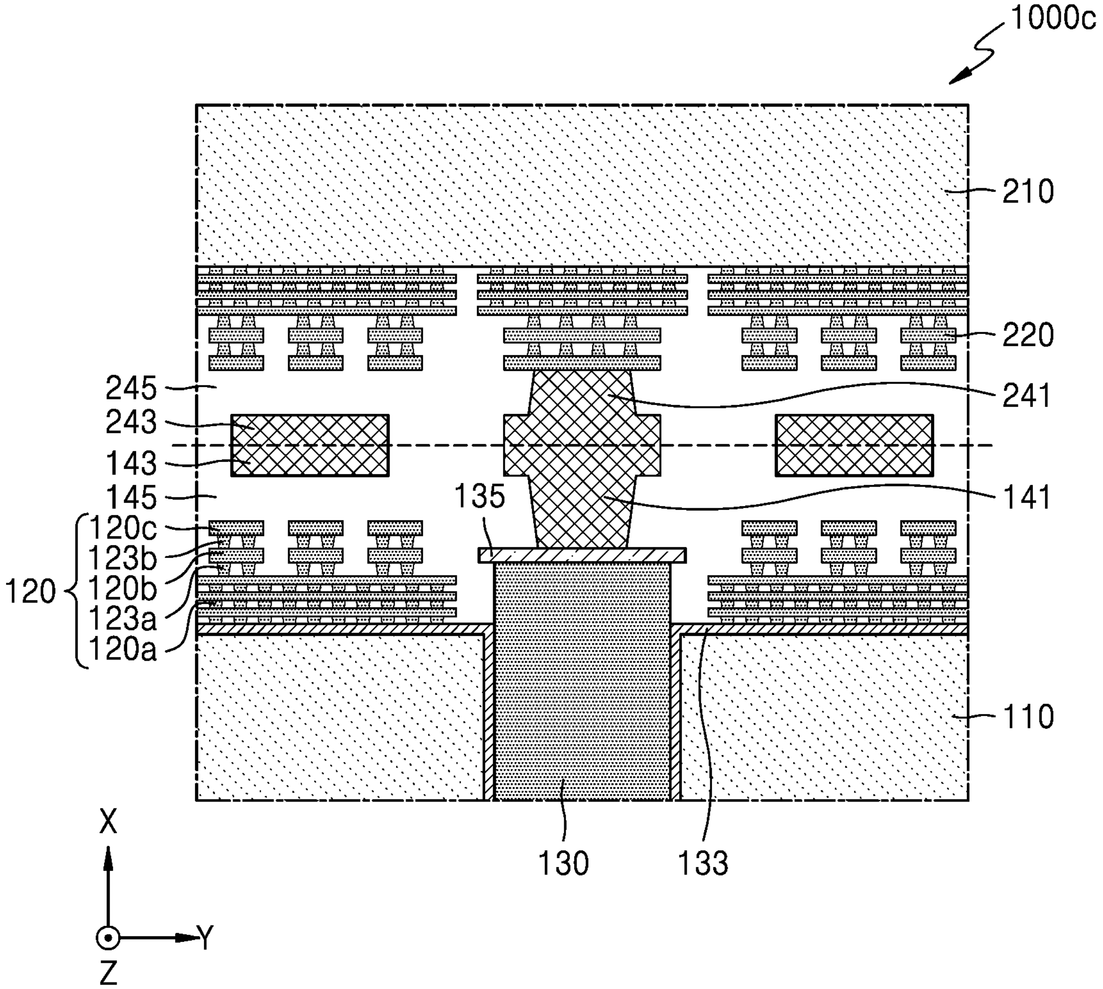
FIG. 3 is an enlarged cross-sectional view of part A of FIG. 1 showing a semiconductor package according to an embodiment of the present inventive concept.

FIG. 3, which shows a diagram of the semiconductor package according to an embodiment of the present inventive concept, is an enlarged cross-sectional view of part A of FIG. 1.

Referring to FIGS. 1 and 3, the semiconductor package 1000*c* may include the first wiring structure 120 including the first semiconductor substrate 110, the plurality of metal wirings 120*a*, 120*b*, and 120*c* located at different vertical levels, and the plurality of vias 123*a* and 123*b* located at different vertical levels, a first semiconductor chip 100 including the plurality of through electrodes 130, a first metal structure 135 arranged on each of the plurality of through electrodes 130, the plurality of first bonding pads 141, the plurality of first dummy structures 143, and the plurality of first wiring insulating layers 145, and the second semiconductor chip 200 including the second semiconductor substrate 210, the second wiring structure 220, the plurality of second bonding pads 241, and the second wiring insulating layer 245.

Each of the plurality of first bonding pads 141 may be located between the second bonding pad 241 corresponding to the first bonding pad 141, and the first metal structure 135. Thus, the first bonding pad 141 may be electrically connected to the second bonding pad 241 and the first metal structure 135. Each of the plurality of first bonding pads 141 may extend from the top surface that is in direct contact with the second bonding pad 241 to the bottom surface that is in direct contact with the first metal structure 135, and the through electrode 130 may protrude from the first semiconductor substrate 110 (e.g., in the vertical direction) to further extend from the first semiconductor substrate 110 to the bottom surface of the first metal structure 135. For example, the level of the upper surface of the through electrode 130 may be greater than the level of the upper surface of the first semiconductor substrate 110. In an embodiment, the bottom surface of each of the plurality of first bonding pads 141 in direct contact with the top surface of the first metal structure 135 may be located in the same vertical level as the top surface of the second metal wiring 120*b*. In this embodiment, the top surface of each of the through electrodes 130 may extend to the same vertical level as the bottom surface of the second metal wiring 120*b*. In an embodiment, the through electrode 130, the first bonding pad 141 corresponding to the through electrode 130, and the first metal structure 135 may be aligned in a vertical direction and overlap one another, and the through electrode 130 may not overlap the first wiring structure 120 in the vertical direction. In an embodiment, the horizontal width of the first bonding pad 141 may decrease towards the first metal structure 135. The first metal structure 135 may include, for example, metal material such as copper, tungsten, or aluminum. For example, the first metal structure 135 may be formed by the same metal wiring process as used to form any one of the plurality of metal wirings 120*a*, 120*b*, and 120*c*, and may have the same material composition as that of any one of the plurality of metal wirings 120*a*, 120*b*, and 120*c*. In some embodiments, the first metal structure 135 may have a bar shape having a constant horizontal width. In some embodiments, the first metal structure 135 may have a rectangular shape in a cross-sectional view, and may have a circular or square shape in a plan view. However, embodiments of the present inventive concept are not limited thereto and the shape of the first metal structure 135 may further vary. In an embodiment, the horizontal width of the first metal structure 135 may be greater than the horizontal width of the first bonding pad 141. For example, the horizontal width of the first metal structure 135 may be greater than the horizontal width of the bottom surface of the first bonding pad 141. In an embodiment, the horizontal width of the first metal structure 135 may be in a range of about 0.5 μm to about 10 μm.

Figure 4A:
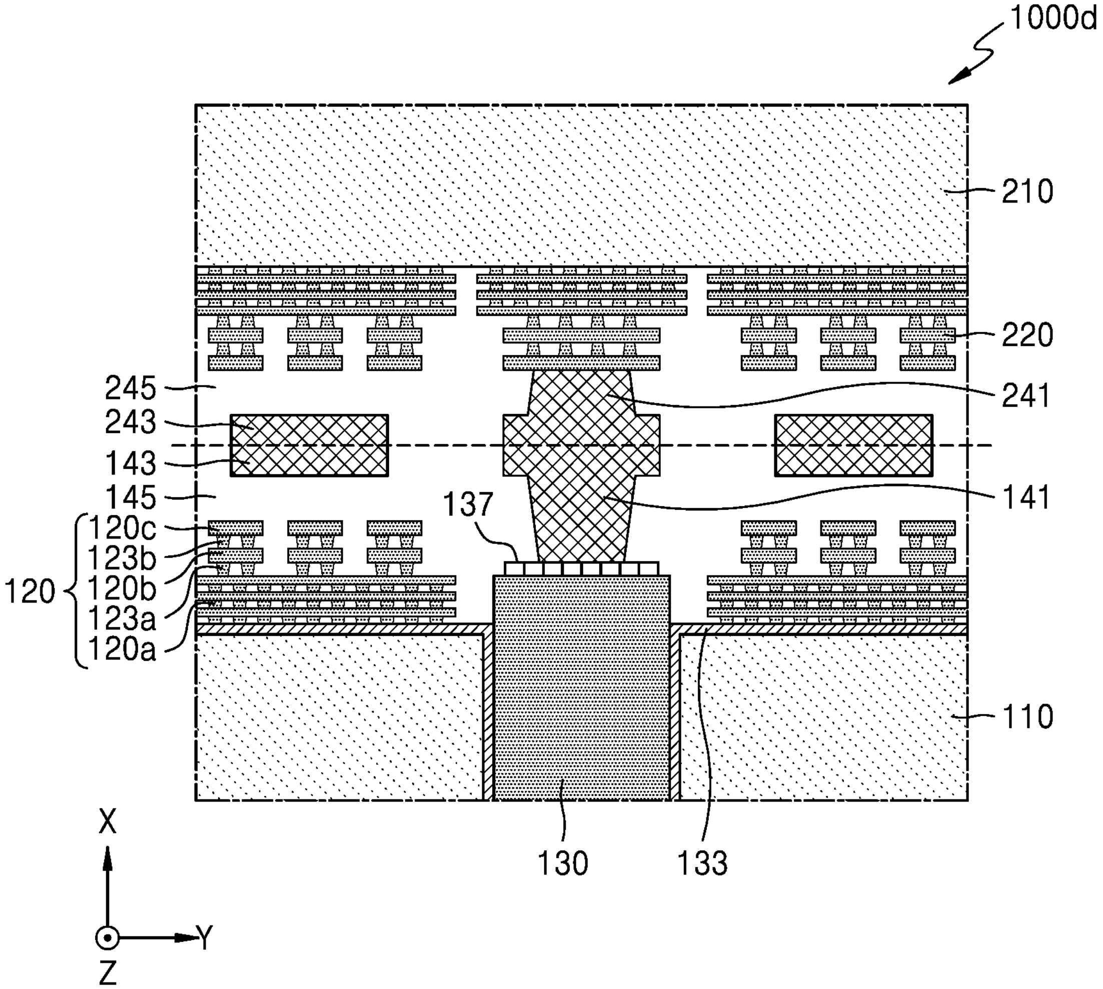
FIGS. 4A and 4B are enlarged cross-sectional views of part A of FIG. 1 showing a semiconductor package according to embodiments of the present inventive concept.
Figure 4B:
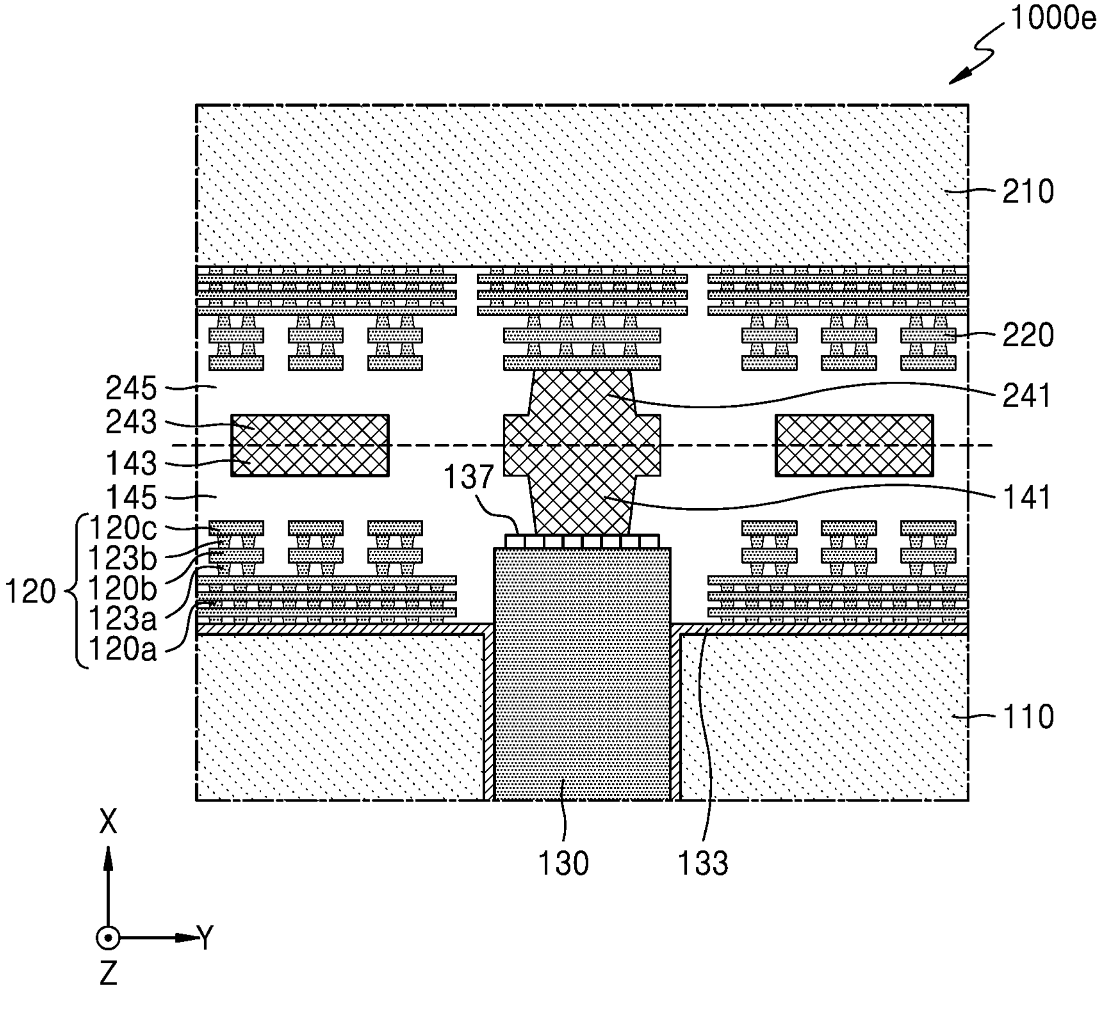

FIGS. 4A and 4B, which show diagrams of the semiconductor package according to embodiments of the present inventive concept, are enlarged cross-sectional views of part A of FIG. 1.

Referring to FIGS. 4A and 4B, the semiconductor package 1000*c* may include the first wiring structure 120 including the first semiconductor substrate 110, the plurality of metal wirings 120*a*, 120*b*, and 120*c* located at different vertical levels, and the plurality of vias 123*a* and 123*b* located at different vertical levels, a first semiconductor chip 100 including the plurality of through electrodes 130, a second metal structure 137, the plurality of first bonding pads 141, the plurality of first dummy structures 143, and the plurality of first wiring insulating layers 145, and the second semiconductor chip 200 including the second semiconductor substrate 210, the second wiring structure 220, the plurality of second bonding pads 241, and the second wiring insulating layer 245.

The plurality of second metal structures 137 may be arranged on the through electrode 130. Each of the plurality of second metal structures 137 may be in direct contact with each other. The plurality of second metal structures 137 may include, for example, metal material such as copper, tungsten, or aluminum. For example, in an embodiment the second metal structures 137 may be formed by the same metal wiring process as used to form any one of the plurality of vias 123*a* and 123*b*, may be located at the same vertical level as that of any one of the plurality of vias 123*a* and 123*b*, and may have the same material composition as that of any one of the plurality of vias 123*a* and 123*b*.

Each of the plurality of first bonding pads 141 may extend from the top surface that is in direct contact with the second bonding pad 241 to the bottom surface that is in direct contact with the second metal structures 137, and the through electrode 130 may protrude from the first semiconductor substrate 110 to further extend from the first semiconductor substrate 110 to the bottom surface of the second metal structures 137.

In an embodiment, the top surface of the plurality of second metal structures 137 may be located at the same vertical level as the top surface of the first via 123*a*. In this embodiment, the top surface of each of the through electrodes 130 may extend to the same vertical level as the bottom surface of the first via 123*a*. However, embodiments of the present inventive concept are not necessarily limited thereto. For example, in an embodiment, the top surface of the plurality of second metal structures 137 may be located at the same vertical level as the top surface of the second via 123*b*. In this embodiment, the top surface of each of the through electrodes 130 may extend to the same vertical level as the bottom surface of the first via 123*b*. In an embodiment, the through electrode 130, the first bonding pad 141 corresponding to the through electrode 130, and the plurality of second metal structures 137 arranged on the through electrode 130 may be aligned in the vertical direction and overlap one another, and the through electrode 130 may not overlap the first wiring structure 120 in the vertical direction. In an embodiment, the horizontal width of the plurality of second metal structures 137 collectively may be greater than the horizontal width of the first bonding pad 141. In an embodiment, the horizontal widths of each of the plurality of second metal structures 137 may be equal to each other. However, embodiments of the present inventive concept are not necessarily limited thereto. For example, in an embodiment the horizontal width of some of the plurality of second metal structures 137 may be greater than that of the other second metal structures 137.

Figure 5:
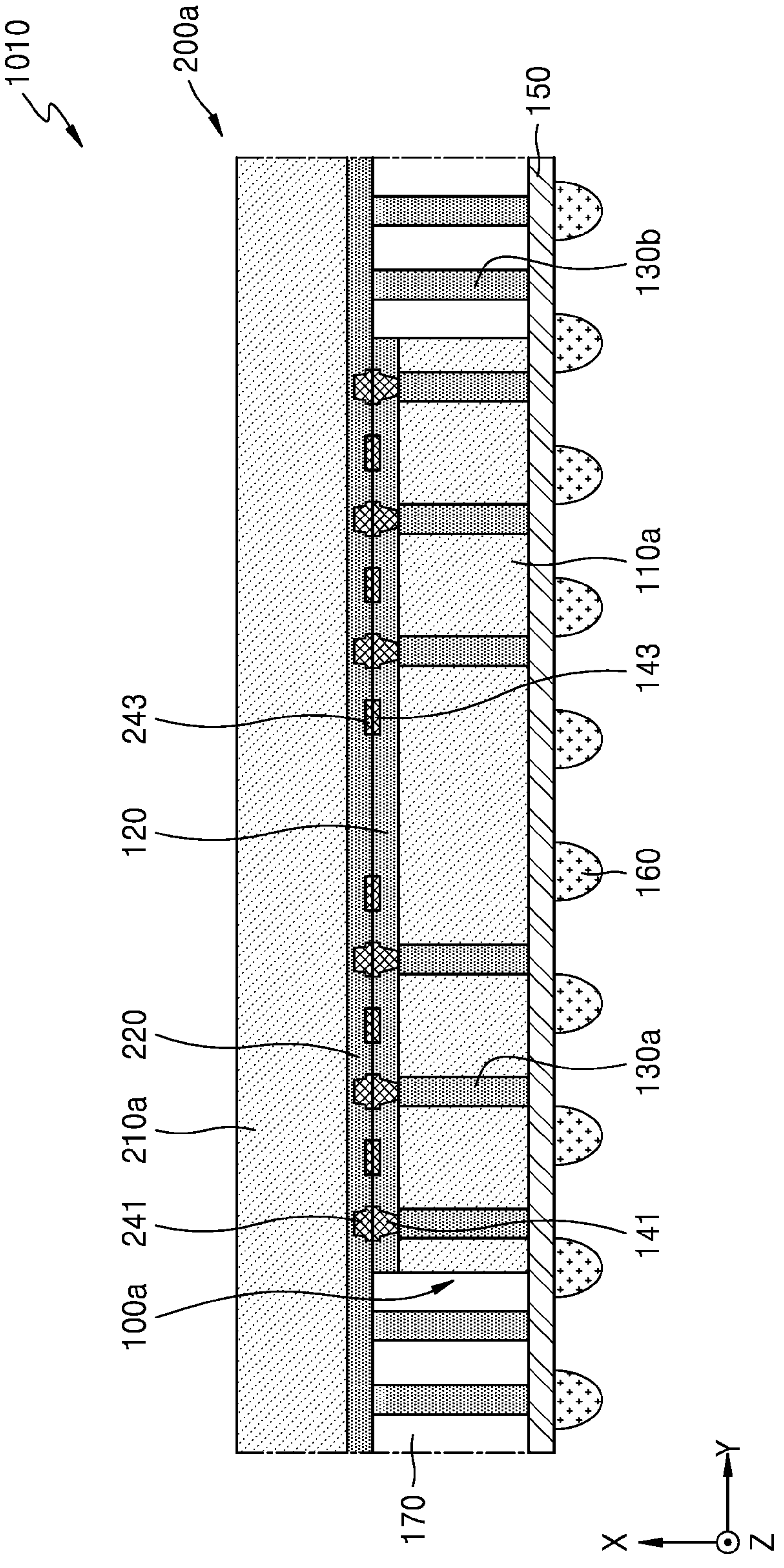
FIG. 5 is a cross-sectional view of the semiconductor package according to an embodiment of the present inventive concept.

FIG. 5 is a cross-sectional view of a semiconductor package 1010 according to an embodiment of the present inventive concept. The semiconductor package 1010 may include a first semiconductor chip 100*a*, a second semiconductor chip 200*a*, and a molding layer 170. A first semiconductor substrate 110*a*, a first wiring structure 120, a first through electrode 130*a*, a first bonding pad 141, and a first dummy structure 143 of the first semiconductor chip 100*a* may respectively be similar to the first semiconductor substrate 110, the first wiring structure 120, the through electrode 130, the first bonding pad 141, and the first dummy structure 143 of the first semiconductor chip 100 of an embodiment shown in FIG. 1, and a second semiconductor chip 200*a*, a second semiconductor substrate 210*a*, a second wiring structure 220, a second bonding pad 241, and a second dummy structure 243 of the semiconductor package 1010 may respectively be similar to the second semiconductor substrate 210, the second wiring structure 220, the second bonding pad 241, and the second dummy structure 243 of the second semiconductor chip 200 of the semiconductor package 1000 of an embodiment of FIG. 1. Therefore, the differences between FIGS. 1 and 5 are mainly described for economy of description.

The first semiconductor chip 100*a* may include the first semiconductor substrate 110*a*, the first wiring structure 120, the first through electrode 130*a*, the first bonding pad 141, and the first dummy structure 143. In an embodiment, the horizontal width of the first semiconductor substrate 110*a* and the horizontal width of the first wiring structure 120 may be the same. The vertical height of the first through electrode 130*a* and the vertical height of the first semiconductor substrate 110*a* may be the same.

In an embodiment, the horizontal width of the first semiconductor chip 100*a* may be less than the horizontal width of the second semiconductor chip 200*a*. For example, the horizontal width of the first wiring structure 120 and the horizontal width of the first semiconductor substrate 110*a* may be less than the horizontal width of the second wiring structure 220 and the horizontal width of the second semiconductor substrate 210*a*, respectively. In an embodiment, the vertical height of the first semiconductor chip 100*a* may be greater than the vertical height of the second semiconductor chip 200*a*. However, embodiments of the present inventive concept are not necessarily limited thereto.

The molding layer 170 may surround at least a portion of the first semiconductor chip 100*a* and the second semiconductor chip 200*a*. For example, the lateral sides and upper surface of the first wiring structure 120 and the lateral sides of the first semiconductor substrate 110*a* may be surrounded by the molding layer 170, and a portion of the bottom surface of the second wiring structure 220 may be surrounded by the molding layer 170. In an embodiment, the molding layer 170 may be, for example, an epoxy molding compound. However, embodiments of the present inventive concept are not necessarily limited thereto.

The second through electrode 130*b* may penetrate through the molding layer 170 and extend in the vertical direction. The top surface of the second through electrode 130*b* may be in direct contact with the bottom surface of the second wiring structure 220, and the bottom surface of the second through electrode 130*b* may be in direct contact with the top surface of the redistribution structure 150. The vertical height of the second through electrode 130*b* may be greater than the vertical height of the first through electrode 130*a* and the vertical height of the first semiconductor substrate 110*a*. In an embodiment, the horizontal width of the second through electrode 130*b* may be the same with the horizontal width of the first through electrode 130*a*. For example, the horizontal width of the second through electrode 130*b* and the horizontal width of the first through electrode 130*a* may be in a range of about 2 μm to about 3 μm. The second through electrode 130*b* may electrically connect the second semiconductor chip 200*a* and the redistribution structure 150.

The redistribution structure 150 may be located on the bottom surface of the first semiconductor substrate 110*a* and the molding layer 170. The horizontal width of the redistribution structure 150 may be greater than the horizontal width of the first semiconductor substrate 110*a*. A plurality of connection bumps 160 may be arranged on the bottom surface of the redistribution structure 150.

The first wiring structure 120 may surround at least a portion of the first bonding pad 141 and the first dummy structure 143. For example, the first wiring structure 120 may surround the lateral sides of the first bonding pad 141 and the bottom surface and lateral sides of the first dummy structure 143.

The second wiring structure 220 may surround at least a portion of the second bonding pad 241 and the second dummy structure 243. For example, the second wiring structure 220 may surround the top surface and lateral sides of the second bonding pad 241 and the top surface and lateral sides of the second dummy structure 243.

In an embodiment, the first wiring structure 120 may include a lower insulating layer. For example, the first wiring structure 120 may include a lower insulating layer similar to the first wiring insulating layer 145 (refer to FIG. 1), and the lower insulating layer may surround at least a portion of the lateral sides of the first bonding pad 141 and the bottom surface and lateral sides of the first dummy structure 143. The second wiring structure 220 may include an upper insulating layer. For example, the second wiring structure 220 may include an upper insulating layer such as the second wiring insulating layer 245 (refer to FIG. 1), and the upper insulating layer may surround at least a portion of the lateral sides of the second bonding pad 141 and the top surface and lateral sides of the second dummy structure 243. In an embodiment, the lower insulating layer may be in direct contact with the upper insulating layer. Thus, the lower insulating layer included in the first semiconductor chip 100*a* may directly contact the upper insulating layer included in the second semiconductor chip 200*a* in an interface where the first semiconductor chip 100*a* is in direct contact with the second semiconductor chip 200*a*.

Figure 6:
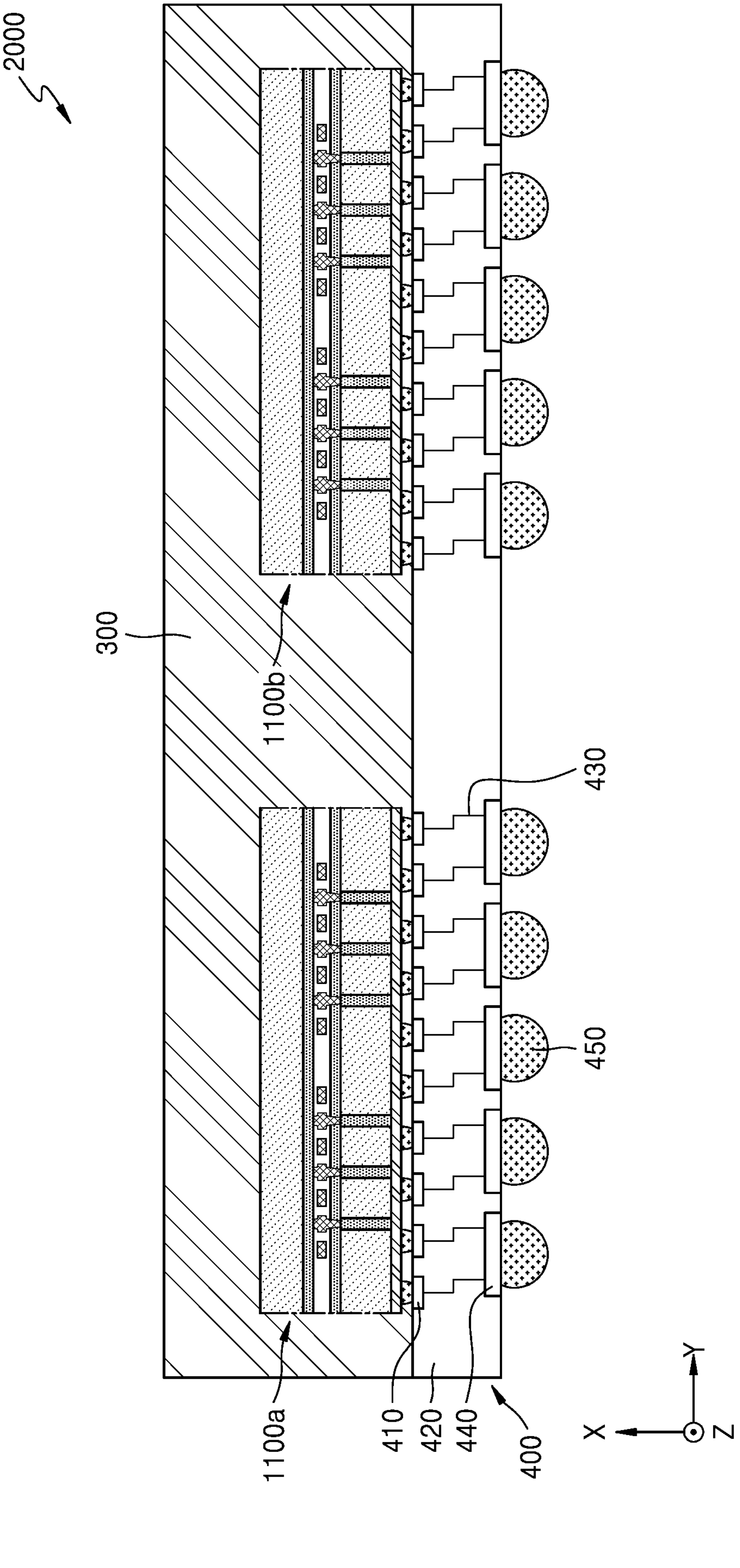
FIG. 6 is a cross-sectional view of a semiconductor package according to an embodiment of the present inventive concept.

FIG. 6 is a cross-sectional view of a semiconductor package 2000 according to an embodiment of the inventive concept. Referring to FIG. 6, the semiconductor package 2000 may include sub semiconductor packages 1100*a* and 1100*b* (hereinafter, also referred to as first sub semiconductor package 1100*a* and second semiconductor package 1100*b*) including the first semiconductor chip 100 and the second semiconductor chip 200 and a main board 400 on which the sub semiconductor packages 1100*a* and 1100*b* are mounted. In an embodiment, the sub semiconductor packages 1100*a* and 1100*b* may be at least one of the semiconductor packages 1000*a*, 1000*b*, 1000*c*, 1000*d*, and 1000*e* illustrated in embodiments of FIGS. 2A to 4B. For example, the first sub semiconductor package 1100*a* may be the semiconductor package 1000*a* illustrated in an embodiment of FIG. 2A, and the second sub semiconductor package 1100*b* may be the semiconductor package 1000*c* illustrated in an embodiment of FIG. 3. However, embodiments of the present inventive concept are not necessarily limited thereto. For example, in an embodiment, unlike the diagram shown in an embodiment of FIG. 6, at least one of the sub semiconductor packages 1100*a* and 1100*b* may be the semiconductor package 1010 shown in an embodiment of FIG. 5. For example, the first sub semiconductor package 1100*a* may be the semiconductor package 1000*a* illustrated in an embodiment of FIG. 2A, and the second sub semiconductor package 1100*b* may be the semiconductor package 1010 illustrated in an embodiment of FIG. 5. Hereinafter, the sub semiconductor packages 1100*a* and 1100*b* are described with reference to FIG. 1.

The sub semiconductor packages 1100*a* and 1100*b* may be attached to the main board 400 through the plurality of connection bumps 160. The sub semiconductor packages 1100*a* and 1100*b* may be electrically connected to each other through the main board 400. The plurality of connection bumps 160 may provide at least one of a signal, power, or ground to the sub semiconductor packages 1100*a* and 1100*b*.

Although the semiconductor package 2000 in FIG. 6 is illustrated to have two sub semiconductor packages 1100*a* and 1100*b*, embodiments of the present inventive concept are not necessarily limited thereto and, for example, the semiconductor package 2000 may include one sub semiconductor package or three or more sub semiconductor packages.

The main board 400 may include a base board layer 420, a first top surface pad 410 and a first bottom surface pad 440 arranged on the top surface and the bottom surface of the base board layer 420, respectively, and a first wiring path

430 electrically connecting the first top surface pad 410 and the first bottom surface pad 440.

In some embodiments, the main board 400 may be a printed circuit board. For example, the main board 400 may be a multi-layer printed circuit board. In an embodiment, the base board layer 420 may include at least one material from among phenol resin, epoxy resin, and polyimide.

A solder resist layer that exposes the plurality of first top surface pads 410 and the plurality of first bottom surface pads 440 may be provided on each of the top surface and bottom surface of the base board layer 420. Each of the plurality of first top surface pads 410 is connected to each of the plurality of connection bumps 160 corresponding to the top surface pad 410, and each of the plurality of first bottom surface pads 440 is connected to each of a plurality of external connection terminals 450 corresponding to the first bottom surface pad 440. The plurality of connection bumps 160 may electrically connect the sub semiconductor packages 1100*a* and 1100*b* to the first top surface pad 410. The plurality of external connection terminals 450 may connect the semiconductor package 2000 to outside devices.

The semiconductor package 2000 may further include a molding layer 300 surrounding both sides and the top surface of the sub semiconductor packages 1100*a* and 1100*b* on the main board 400. The molding layer 300 may include, for example, an epoxy mold compound (EMC).

In some embodiments, the semiconductor package 2000 may not include the main board 400 and may include, for example, an interposer, and the sub semiconductor packages 1100*a* and 1100*b* may be mounted on the interposer.

Figure 7:
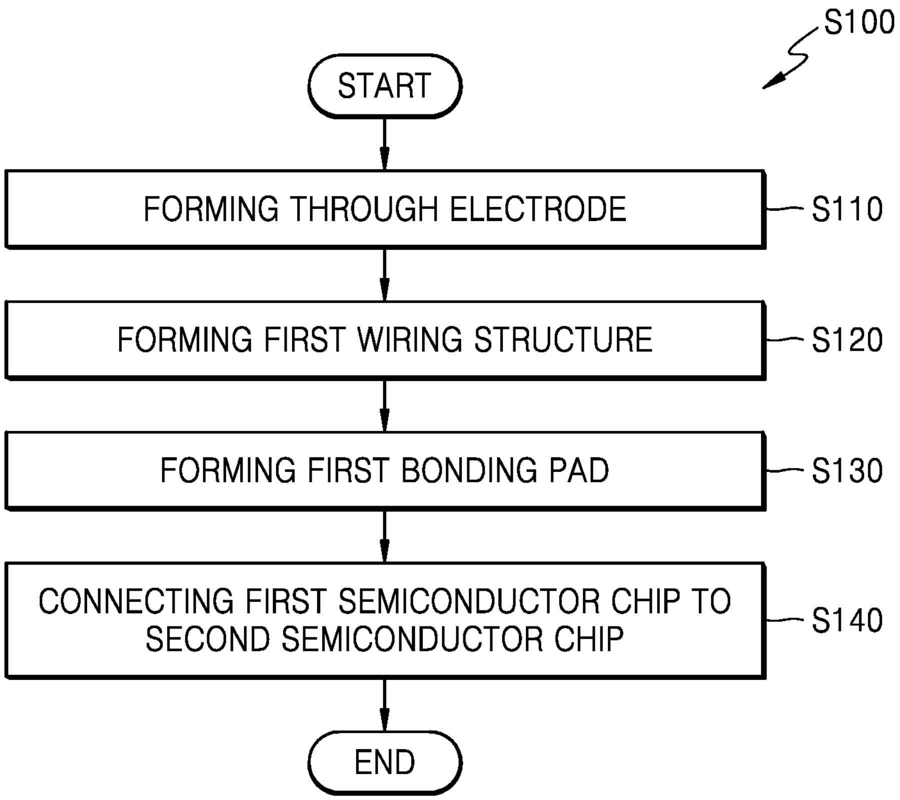
FIG. 7 is a flow chart of a method of manufacturing the semiconductor package according to an embodiment of the present inventive concept.

FIG. 7 is a flow chart of a method of manufacturing the semiconductor package according to an embodiment of the present inventive concept. FIGS. 8A to 8G are cross-sectional views showing each operation of the method of manufacturing the semiconductor package according to embodiments of the present inventive concept.

Referring to FIGS. 7 and 8A to 8C, the plurality of through electrodes 130 may be formed on the first semiconductor substrate 110. Operation S110 may include forming an opening O in the first semiconductor substrate 110, forming an insulating layer 133, and filling the opening O with conductive materials.

In an embodiment, the opening O may be formed by, for example, a dry etching process. However, embodiments of the present inventive concept are not necessarily limited thereto. In the dry etching process, plasma ion, for example, may be used, but embodiments of the present inventive concept are not necessarily limited thereto.

The insulating layer 133 may be formed by, for example, a deposition process, etc. The insulating layer 133 may cover both lateral sides and the bottom surface of the opening O, and the top surface of the first semiconductor substrate 110. In an embodiment, the insulating film 133 may include, for example, any one of silicone oxide, silicone nitride, and silicon oxynitride, but embodiments of the present inventive concept are not necessarily limited thereto. In some embodiments, a portion of the insulating layer 133 covering the top surface of the first semiconductor substrate 110 may be removed.

The conductive material may fill the inside of the opening (O). In an embodiment, the conductive material may include, for example, metal material such as copper. The conductive material may fill the inside of the opening O by, for example, electrolytic plating method, physical vapor deposition method, electroless plating method, etc. After the conductive material fills the inside of the opening, the through electrode 130 may be formed through a chemical mechanical polishing process in operation S110.

Figure 8A:
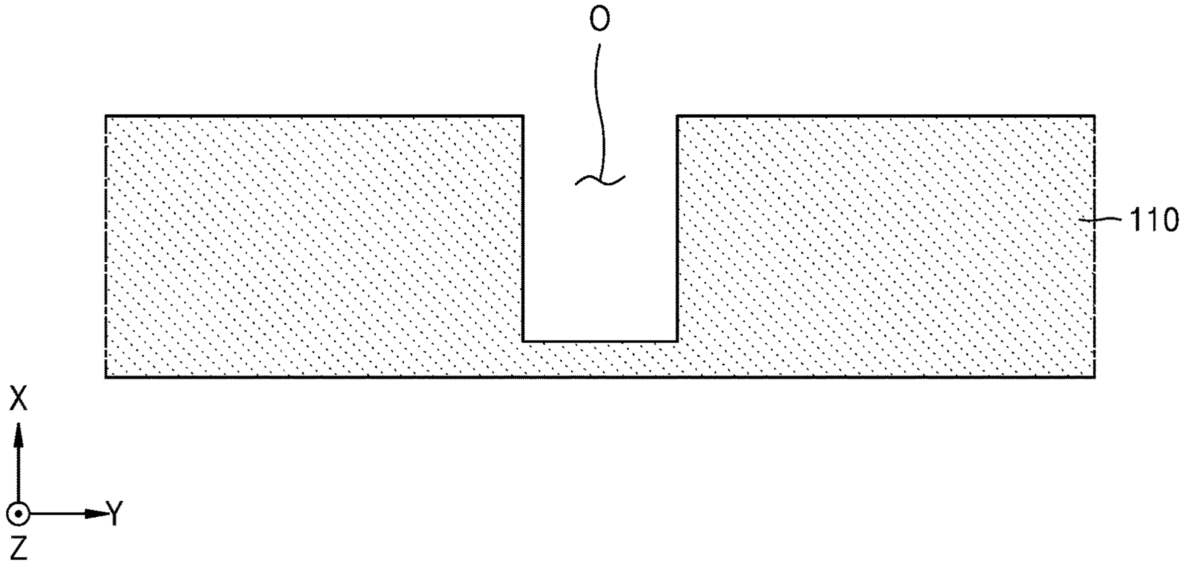
FIGS. 8A to 8G are cross-sectional views showing operations of the method of manufacturing the semiconductor package according to embodiments of the present inventive concept.
Figure 8B:
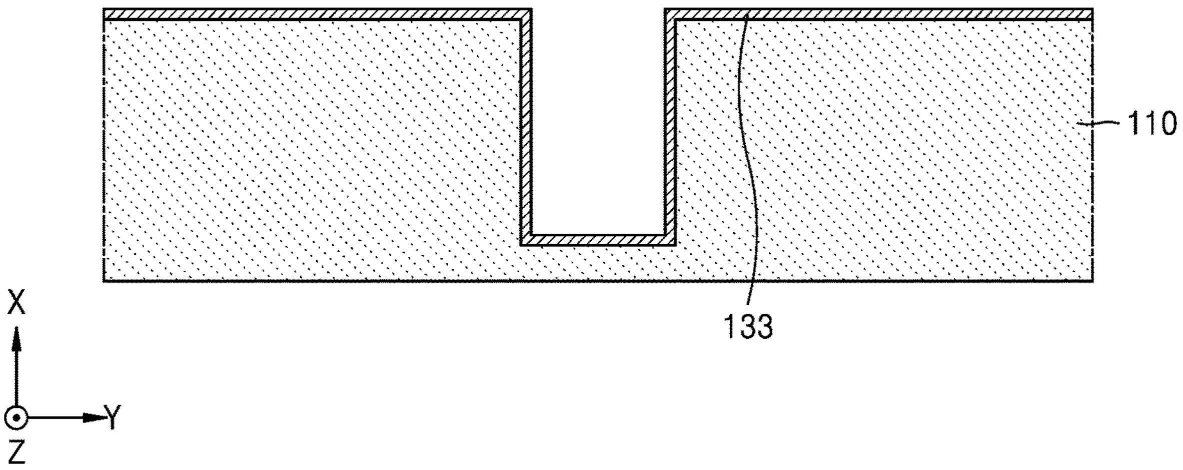
Figure 8C:
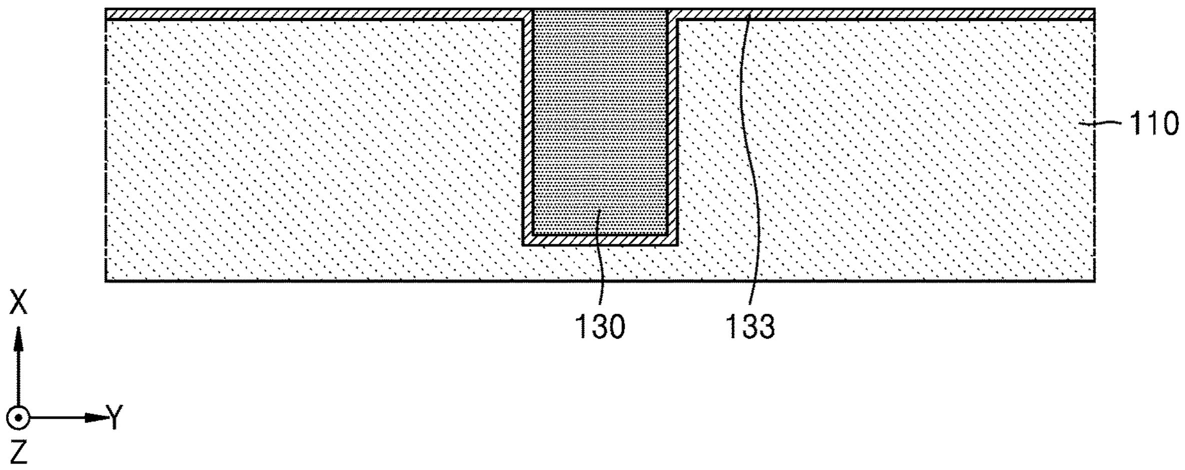
Figure 8D:
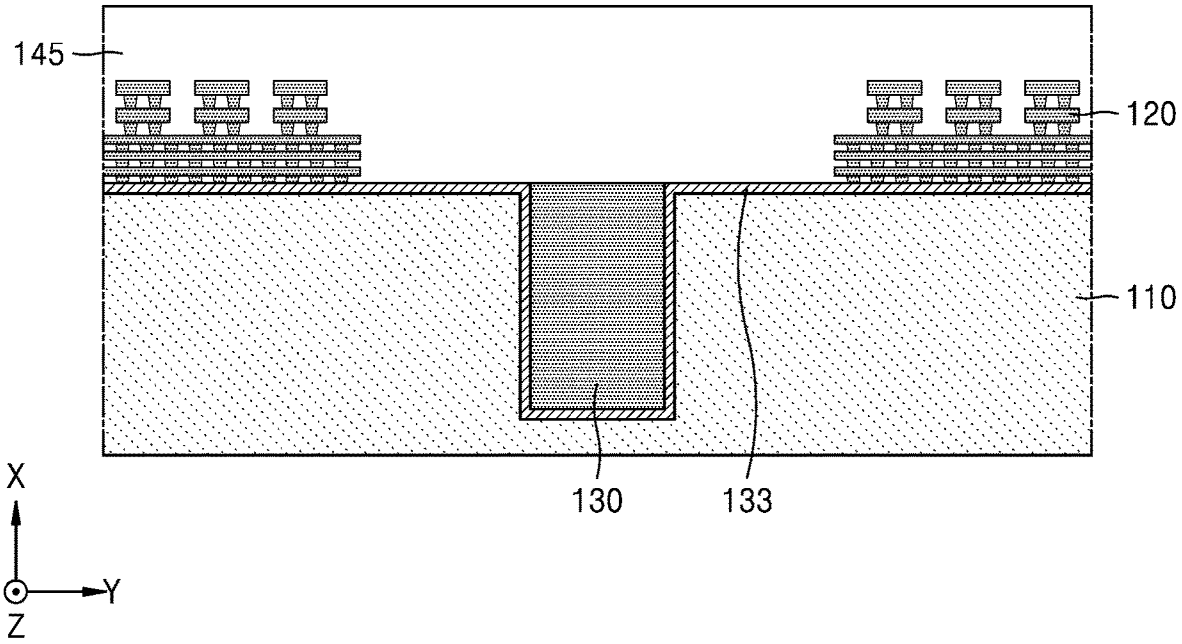

Referring to FIGS. 7 and 8D, the first wiring structure 120 and the first wiring insulating layer 145 may be formed in operation S120. In an embodiment, the first wiring structure 120 may include the first to third metal wirings 120*a*, 120*b*, and 120*c*. The first to third metal wirings 120*a*, 120*b*, and 120*c* may be formed sequentially. For example, after the first wiring insulating layer 145 is formed on the first semiconductor substrate 110, a portion of the first wiring insulating layer 145 may be etched to form a trench, and the first metal wiring 120*a* (FIG. 2A) may be formed in the trench. Then, by repeating the same process, the second metal wiring 120*b* (FIG. 2A) and the third metal wiring 120*c* (FIG. 2A) may be formed sequentially. The first wiring structure 120 may be formed only on a portion of the first semiconductor substrate 110. For example, the first wiring structure 120 may not be formed on the through electrode 130.

Figure 8E:
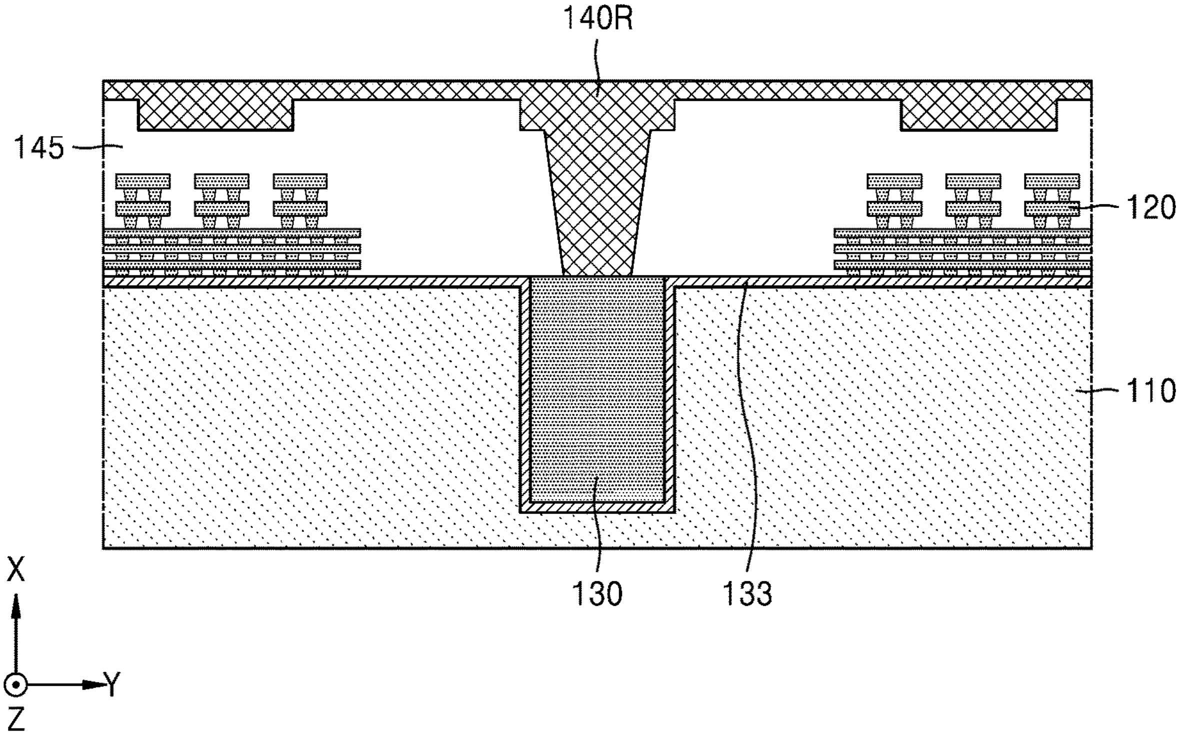
Figure 8F:
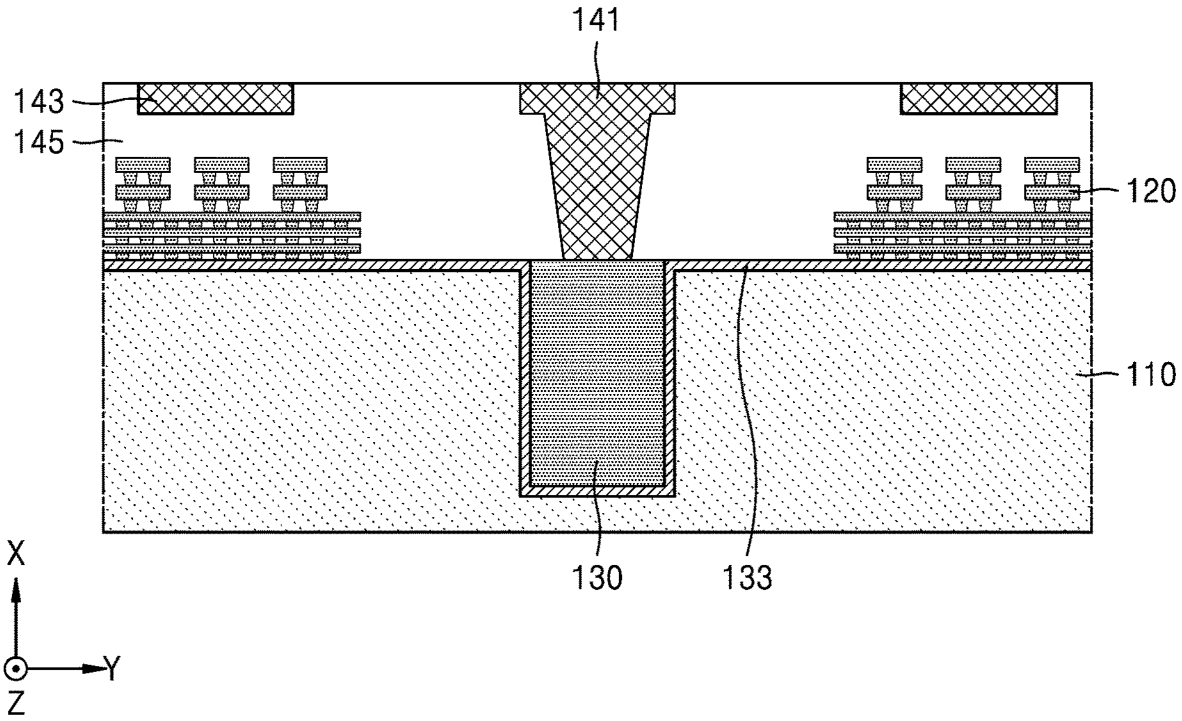

Referring to FIGS. 7, 8E, and 8F, the first bonding pad 141 and the first dummy structure 143 may be formed in operation S130. Operation S130 may include etching a portion of the first wiring insulating layer 145, filling the first wiring insulating layer 145 with the conductive material 140R, and planarizing the conductive material 140R.

In the operation of etching a portion of the first wiring insulating layer 145, the first wiring insulating layer 145 may be formed by, for example, a dry etching process, but embodiments of the present inventive concept are not necessarily limited thereto. In the dry etching process, plasma ion, for example, may be used, but embodiments of the present inventive concept are not necessarily limited thereto. The etching operation may be performed several times. For example, the first etching operation may be performed in a region in which the first dummy structures 143 and the first bonding pad 141 are formed, and a second etching operation may be performed in a region in which the first bonding pad 141 is formed. Through the second etching operation, the top surface of the through electrode 130 may be exposed.

The conductive material 140R may fill the openings formed by the etching operations. In an embodiment, the conductive material 140R may include, for example, metal materials such as copper. The conductive material 140R may fill the inside of the openings by, for example, electrolytic plating method, physical vapor deposition method, electroless plating method, etc. By exposing the top surface of the through electrode 130 through the opening of the region in which the first bonding pad 141 is formed, the conductive material 140R may be in direct contact with the top surface of the through electrode 130.

The conductive material 140R that fills the inside of the opening may be planarized by a chemical mechanical polishing process. For example, the planarizing process may be a CMP process, but embodiments of the present inventive concept are not necessarily limited thereto.

Figure 8G:
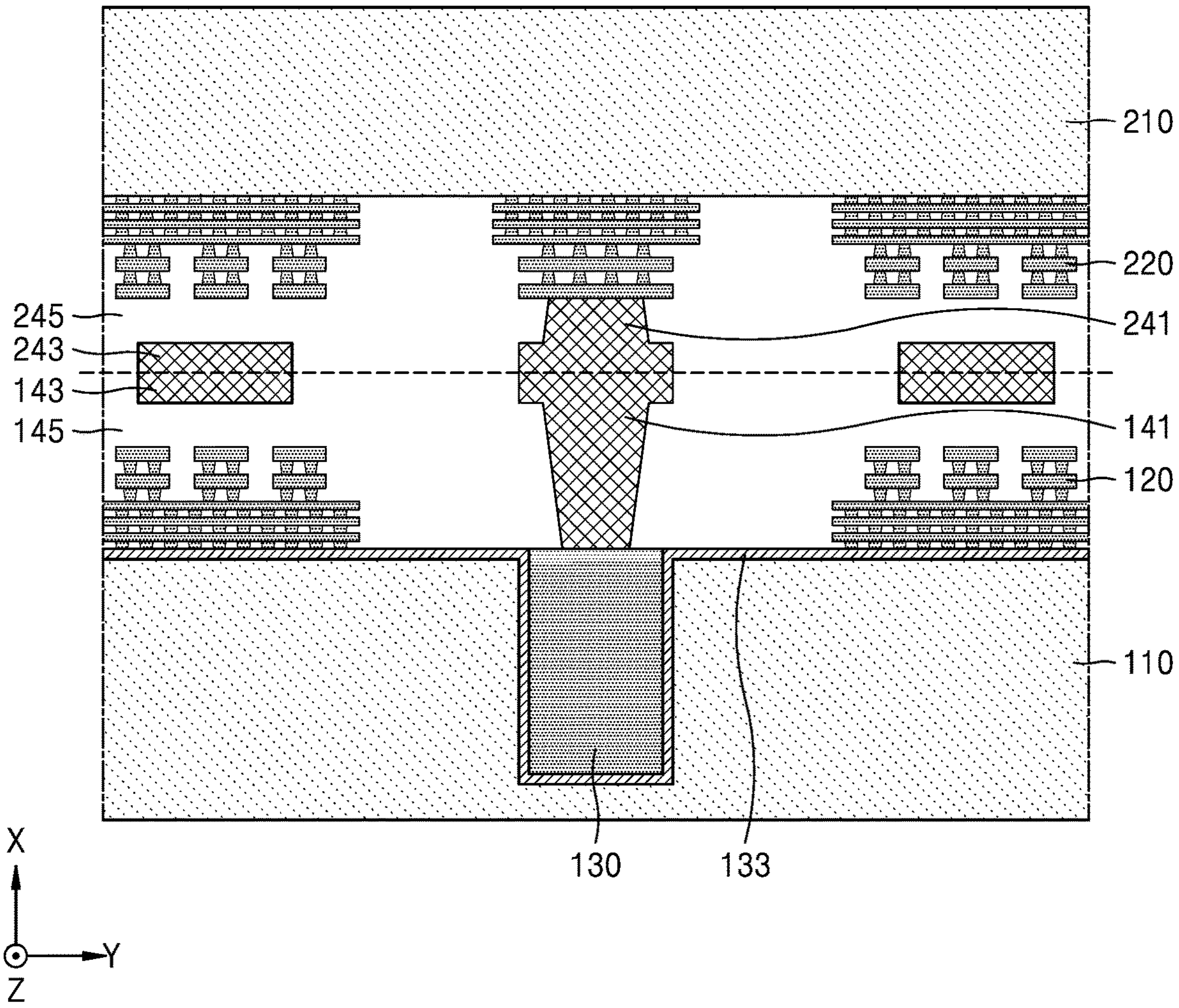

Referring to FIGS. 7 and 8G, the first semiconductor chip 100 may be connected to the second semiconductor chip 200 S140. In an embodiment, the first bonding pad 141 may be placed in direct contact with the second bonding pad 241 by a hybrid bonding process, and thus the first semiconductor chip 100 may be electrically connected to the second semiconductor chip 200. Operation S140 may accompany a heat treatment process. For example, operation S140 may accompany a low temperature annealing process. The first bonding pad 141 may be directly connected to the through electrode 130 to thereby increase the SI and PI characteristics of the semiconductor package 1000, and the first bonding pad 141 may extend from the top surface that is in direct contact with the second bonding pad 241 to the bottom surface that is in direct contact with the through electrode 130 to thereby secure process conditions for the hybrid bonding process.

While the present inventive concept has been particularly shown and described with reference to non-limiting embodiments thereof, it will be understood that various changes in form and details may be made therein without departing from the spirit and scope of the present inventive concept.

What is claimed is:

1. A semiconductor package comprising:

a first semiconductor chip comprising a first semiconductor substrate having active and inactive surfaces that are opposite to each other, a first wiring structure arranged on the active surface of the first semiconductor substrate, a plurality of through electrodes penetrating through at least a portion of the first semiconductor substrate, and a plurality of first bonding pads respectively connected to the plurality of through electrodes; and a second semiconductor chip stacked on the first semiconductor chip and comprising a second semiconductor substrate having active and inactive surfaces that are opposite to each other, a second wiring structure arranged on the active surface of the second semiconductor substrate, and a plurality of second bonding pads respectively connected to the plurality of first bonding pads and arranged on the active surface of the second semiconductor substrate, wherein one of the plurality of first bonding pads has a top surface that is in direct contact with one of the plurality of second bonding pads and a bottom surface that is in direct contact with one through electrode of the plurality of through electrodes, the one of the plurality of first bonding pads includes a first portion having the bottom surface and a second portion having the top surface, the first portion and the second portion are integrally formed as a single structure, and in a cross-sectional view of the semiconductor package, the one of the plurality of first bonding pads includes opposing side surfaces each extending from the top surface of the one of the plurality of first bonding pads to the bottom surface of the one of the plurality of first bonding pads, and each side surface of the one of the plurality of first bonding pads includes at most one step.

2. The semiconductor package of claim 1, wherein the bottom surface of the one of the plurality of first bonding pads is located at a same vertical level as a bottom surface of the first wiring structure.

3. The semiconductor package of claim 1, wherein a horizontal width of the one of the plurality of through electrodes is greater than a horizontal width of the one of the plurality of first bonding pads.

4. The semiconductor package of claim 1, wherein:

the one of the plurality of first bonding pads includes a first portion in direct contact with the one of the plurality of second bonding pads and a second portion in direct contact with the one through electrode of the plurality of through electrodes; and a horizontal width of the first portion is constant and a horizontal width of the second portion decreases in a direction towards the one through electrode of the plurality of through electrodes.

5. The semiconductor package of claim 1, wherein the one of the plurality of first bonding pads has a taper shape in which a horizontal width of the one of the plurality of first bonding pads gradually decreases from the top surface that is in direct contact with the one of the plurality of second bonding pads to the bottom surface that is in direct contact with the one through electrode.

6. The semiconductor package of claim 1, wherein the one of the plurality of through electrodes overlaps the one of the plurality of first bonding pads in a vertical direction and does not overlap the first wiring structure in a vertical direction.

7. The semiconductor package of claim 1, wherein a vertical height of the one of the plurality of first bonding pads is greater than a vertical height of the one of the plurality of second bonding pads.

8. The semiconductor package of claim 1, wherein a vertical height of the one of the plurality of first bonding pads is in a range of about 3 μm to about 20 μm.

* * * * *